US009487862B2

(12) United States Patent
Horino (10) Patent No.: US 9,487,862 B2
(45) Date of Patent: Nov. 8, 2016

(54) SEMICONDUCTOR GROWING APPARATUS

(75) Inventor: Kazuhiko Horino, Kanagawa (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 1082 days.

(21) Appl. No.: 13/190,710

(22) Filed: Jul. 26, 2011

(65) Prior Publication Data

US 2012/0024231 A1    Feb. 2, 2012

(30) Foreign Application Priority Data

Jul. 28, 2010   (JP) .................................. 2010-169815

(51) Int. Cl.
  *C23C 16/455*    (2006.01)
  *C23C 16/458*    (2006.01)
  *C30B 25/12*     (2006.01)

(52) U.S. Cl.
  CPC ........... *C23C 16/4586* (2013.01); *C30B 25/12* (2013.01)

(58) Field of Classification Search
  CPC .......................... C23C 16/4586; C30B 25/12
  USPC .................... 118/728; 156/345.51, 345.52
  See application file for complete search history.

(56) References Cited

U.S. PATENT DOCUMENTS

| | | | | |
|---|---|---|---|---|
| 6,454,865 | B1* | 9/2002 | Goodman | C23C 16/4581 118/500 |
| 2003/0049580 | A1* | 3/2003 | Goodman | 432/258 |
| 2004/0144323 | A1* | 7/2004 | Kai | 118/728 |
| 2007/0186853 | A1* | 8/2007 | Gurary | C23C 16/4586 118/720 |
| 2012/0272892 | A1* | 11/2012 | Paranjpe et al. | 117/86 |

FOREIGN PATENT DOCUMENTS

| | | |
|---|---|---|
| JP | 62-042416 A | 2/1987 |
| JP | 2010-171083 A | 8/2010 |

OTHER PUBLICATIONS

Office Action dated Feb. 18, 2014, issued in Japanese Patent Application No. 2010-169815 With English Translation(4 pages).

* cited by examiner

*Primary Examiner* — Rudy Zervigon
(74) *Attorney, Agent, or Firm* — Westerman, Hattori, Daniels & Adrian, LLP (57) ABSTRACT

A semiconductor growing apparatus including: a susceptor having a main face and a side face, the main face receiving a substrate for growing a semiconductor layer, and the side face having a groove; a heating element for heating the susceptor.

15 Claims, 6 Drawing Sheets

SEMICONDUCTOR GROWING APPARATUS

CROSS-REFERENCE TO RELATED APPLICATION

This application is based upon and claims the benefit of priority of the prior Japanese Patent Application No. 2010-169815, filed on Jul. 28, 2010, the entire contents of which are incorporated herein by reference.

BACKGROUND (i) Technical Field

The present invention relates to a semiconductor growing apparatus.

(ii) Related Art

A susceptor holds a substrate when growing a semiconductor on the substrate with a vapor-phase epitaxial method. The substrate is heated via the susceptor. In this case, temperature distribution of the substrate may be uneven.

Japanese Patent Application Publication No. 62-42416 (hereinafter referred to as Document 1) discloses a structure in which a ring-shaped hollow is formed in a susceptor in order to make the temperature distribution even in a deposition process. In concrete, FIG. 2A of Document 1 discloses susceptor formed with a casting in which a ring-shaped hollow is formed. Further, in view of difficulty of forming of the ring-shaped hollow in the susceptor formed with the casting, FIG. 1 of Document 1 discloses a susceptor that has a main body of the susceptor having a cylinder-shaped recess at center of an upper face thereof and a base having a T-shaped cross section located in the recess.

SUMMARY

However, it is extremely difficult to form the ring-shaped hollow in the susceptor formed with the casting. The susceptor is extremely expensive. Therefore, that kind of susceptor is not useful. In a case of a susceptor in which two members are jointed, gas such as air left in the ring-shaped hollow before a deposition process may leak from the hollow through a clearance between the jointed two members in the deposition process. In this case, the leaked gas may cause quality degradation of a semiconductor layer formed in the deposition process. Therefore, the susceptor having the ring-shaped hollow formed with the two members is not useful.

It is an object of the present invention to provide a semiconductor growing apparatus that improves temperature distribution of a substrate in a deposition process.

According to an aspect of the present invention, there is provided a semiconductor growing apparatus including: a susceptor having a main face and a side face, the main face receiving a substrate for growing a semiconductor layer, and the side face having a groove; a heating element for heating the susceptor.

DETAILED DESCRIPTION

A description will be given of a best mode for carrying the present invention.

First Embodiment

A description will be given of a semiconductor growing apparatus 5 in accordance with a first embodiment. The semiconductor growing apparatus 5 is used in a deposition process for forming a semiconductor layer on a substrate 100. In concrete, the semiconductor growing apparatus 5 is used in a deposition process in which the substrate 100 is heated. The deposition process is, for example, a vapor-phase deposition such as CVD (Chemical Vapor Deposition), MOCVD (Metal Organic Chemical Vapor Deposition) or Plasma CVD (Plasma Chemical Vapor Deposition).

Figure 1A:
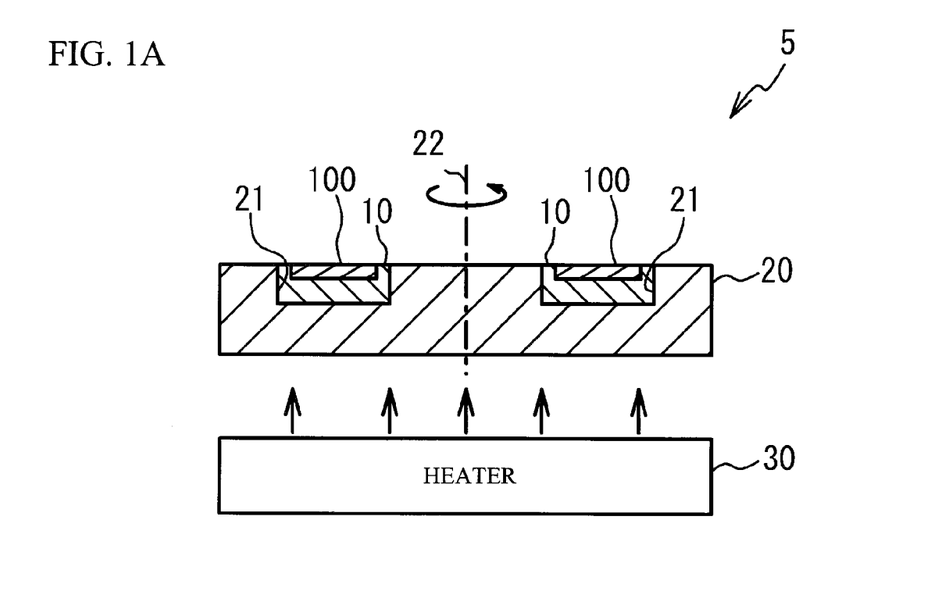
FIG. 1A illustrates a schematic cross sectional view of a semiconductor growing apparatus in accordance with a first embodiment.
Figure 1B:
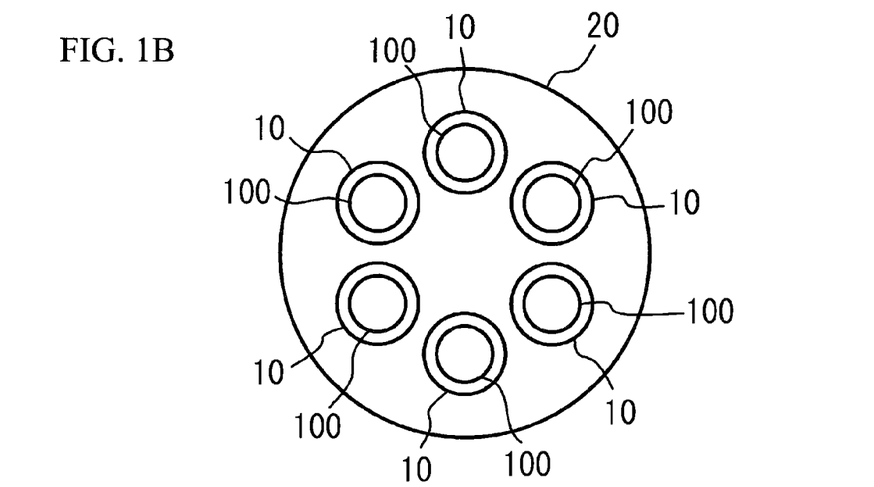
FIG. 1B illustrates a schematic top view of the semiconductor growing apparatus of FIG. 1A.

FIG. 1A illustrates a schematic cross sectional view of the semiconductor growing apparatus 5 in accordance with the first embodiment. FIG. 1B illustrates a schematic top view of the semiconductor growing apparatus 5 of FIG. 1A. The semiconductor growing apparatus 5 has a susceptor 10, a tray 20, and a heater 30. The susceptor 10 and the tray 20 are provided in a chamber in a deposition process.

The susceptor 10 holds the substrate 100 in the deposition process. The type of the substrate 100 is not limited. The type of the substrate 100 may be selected adequately according to a type of a semiconductor layer to be formed on the substrate 100. Details of the susceptor 10 will be described later.

The tray 20 is a base for supporting the susceptor 10. In the embodiment, the tray 20 has one or more recess portion 21 where the susceptor 10 is to be mounted. The susceptor 10 is mounted on an upper face of the tray 20. That is, the tray 20 acts as a support substrate.

In the embodiment, the number of the recess portions 21 is two or more. The recess portions 21 are arrayed concentrically around a center axis 22. The tray 20 rotates around the center axis 22 in the deposition process. However, the tray 20 may not rotate in the deposition process.

The heater 30 heats the tray 20. Material of the tray 20 is not limited, if the material resists the heat of the heater 30. For example, the tray 20 includes carbon mainly. The susceptor 10 is mounted on the tray 20. In the embodiment, the susceptor 10 is only placed on the tray 20, and is not fixed to the tray 20 with a screw. This is because when the susceptor 10 is fixed to the tray 20 with a screw, temperature distribution is appears around the screw. Therefore, the susceptor 10 has no hole for a screw. The tray 20 may not have the recess portion 21 when the susceptor 10 can be mounted on the tray 20. For example, the upper face of the tray 20 may be flat. However, the tray 20 with the recess portion 21 is more preferable than the tray 20 without the recess portion 21, because the temperature of the susceptor 10 is increased effectively.

The heater 30 operates in the deposition process, and increases the temperature of the tray 20. That is, the heater 30 acts as a temperature increasing portion for increasing the temperature of the tray 20 (the support substrate). For example, the heater 30 is a resistive heater. The tray 20 and the heater 30 act as a heating portion for heating the susceptor 10. However, the heater 30 may be another type of heater if the heater 30 can increase the temperature of the tray 20. The heater may be a radio-heating heater.

The deposition process may be performed as follows. The substrate 100 is placed on the susceptor 10 in the chamber. The substrate 100 may be selected according to a semiconductor layer to be formed on the substrate 100. The substrate 100 may be selected from Si, GaAs, SiC, InP, GaN, sapphire, and so on. In the embodiment, the substrate 100 is made of InP. Then, gas pressure in the chamber is reduced, and extra gas is removed from the chamber. Next, the heater 30 is operated. Then, the temperature of the tray 20 is increased. The substrate 100 is heated because of heat conduction from the tray 20 and the susceptor 10. Reaction gas such as phosphine ($PH_3$), arsine ($AsH_3$), tri-methyl gallium, tri-methyl indium, or tri-methyl aluminum is provided on the substrate 100 in a condition where the temperature of the substrate 100 reaches a predetermined value. In this case, the tray 20 is rotating around the center axis 22. Thus, a semiconductor layer such as AlInAs, AlGaInAs, GaInAsP, or InP is formed on the substrate 100.

After the deposition process, a washing process for washing the substrate 100 is performed. The washing process is not limited. For example, the washing process of the substrate 100 is putting the substrate 100 into washing liquid such as acid for a predetermined time.

Figure 2A:
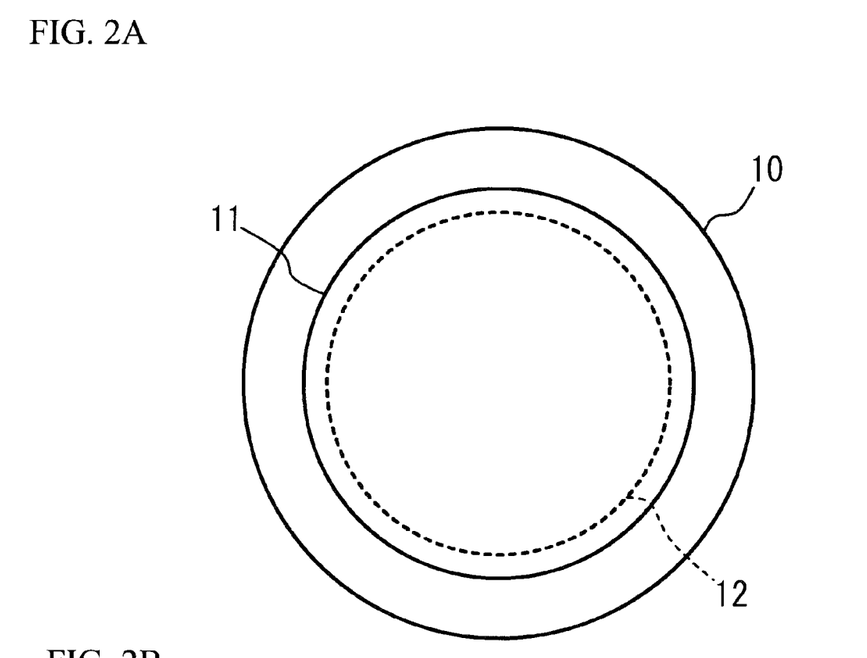
FIG. 2A illustrates a top view of a susceptor in accordance with the first embodiment.
Figure 2B:
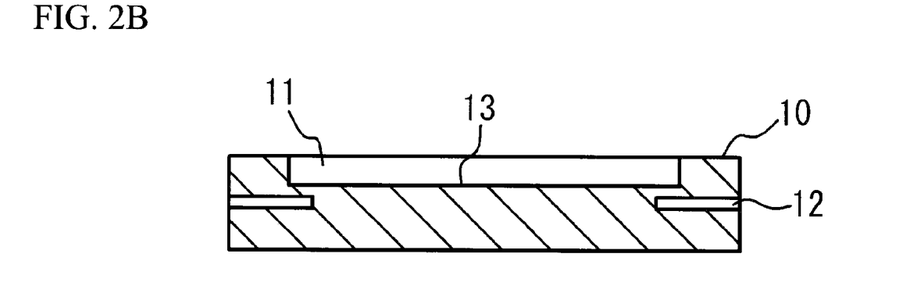
FIG. 2B illustrates a cross sectional view of the susceptor of FIG. 2A.

Next, a description will be given of the details of the susceptor 10. FIG. 2A illustrates a top view of the susceptor 10. FIG. 2B illustrates a cross sectional view of the susceptor 10. An external shape of the susceptor 10 is not limited. In the embodiment, the susceptor 10 has a disk shape. The susceptor 100 has a recess portion 11 on an upper face (a main face) where the substrate 100 is to be mounted. In the embodiment, the shape of the recess portion 11 is a circle around the center of the susceptor 10 when viewed from upper side of the susceptor 10. However, the shape and the position of the recess portion 11 are not limited to the structure. For example, the recess portion 11 may not have the circle shape. The position of the recess portion 11 may be shift from the center of the susceptor 10.

The substrate 100 is placed on the recess portion 11 in the deposition process. Thus, the recess portion 11 holds the substrate 100 in the deposition process. That is, the recess portion 11 acts as a holding portion for holding the substrate 100. The face of the recess portion 11 where the substrate 100 is to be mounted (hereinafter referred to as a mounting face 13) is flat. That is, the mounting face 13 is a bottom face of the holding portion. However, the holding portion of the susceptor 10 is not limited to the recess portion 11. The susceptor 10 may have a convex portion on the upper face thereof for holding the substrate 100, instead of the recess portion 11. In this case, the convex portion acts as the holding portion. The susceptor 10 may not have the recess portion 11 or the convex portion. The susceptor 10 only has to have the mounting face 13 where the substrate 100 is to be mounted.

The susceptor 10 has a groove 12. The groove 12 extends from a circumference face (side face) of the susceptor 10 to inner side of the susceptor 10. The groove 12 extends to a position below a circumference edge of the mounting face 13. The groove 12 is formed at intermediate of a thickness direction of the susceptor 10. Therefore, the susceptor 10 acts as three parts. The three parts are an upper part including the mounting face 13, a middle part including the groove 12, and a lower part facing with the upper part through the middle part. The susceptor cannot be physically divided into the three parts. The groove 12 is sandwiched between walls vertically. The walls are the upper part and the lower part of the susceptor 10. Temperature stability is needed for the upper part of the susceptor 10 receiving the substrate 100. The lower part of the susceptor 10 contributes to the temperature stability. That is, the upper part of the susceptor 10 is subjected to radiation heat from the lower part. Without the lower part, the upper part is subjected to radiation heat from the tray 20 directly. The tray 20 is fixed to the semiconductor growing apparatus 5. That is, the tray 20 is closer to the main body of the semiconductor growing apparatus 5 than the susceptor 10. Thus, the tray 20 is subjected to the temperature between the temperature of the main body of the semiconductor growing apparatus 5 (substantially the same as outer temperature) and growing temperature achieved by the heater. Therefore, the tray 20 has low temperature stability. The lower part of the susceptor 10 is positioned between the tray 20 and the upper part of the susceptor 10. The structure restrains direct influence of the radiation heat from the tray 20 on the circumference area of the substrate 100 in the upper part of the susceptor 10. That is, the lower part of the susceptor 10 restrains the radiation heat from the tray 20 having low temperature stability. This contributes to stability of growth distribution of the semiconductor layer formed on the substrate 100. The groove 12 is formed throughout the circumference face of the susceptor 10. In the embodiment, the groove 12 is formed in parallel with the mounting face 13.

The material of the susceptor 10 is not limited. It is preferable that the material of the susceptor 10 is difficult to deform with respect to heat and is difficult to react with a reactant gas. Preferable material is, for example, carbon, silicon carbide, aluminum nitride, and so on. With the material, the recess portion 11 and the groove 12 can be formed by mechanical process such as cutting process.

Figure 3A:
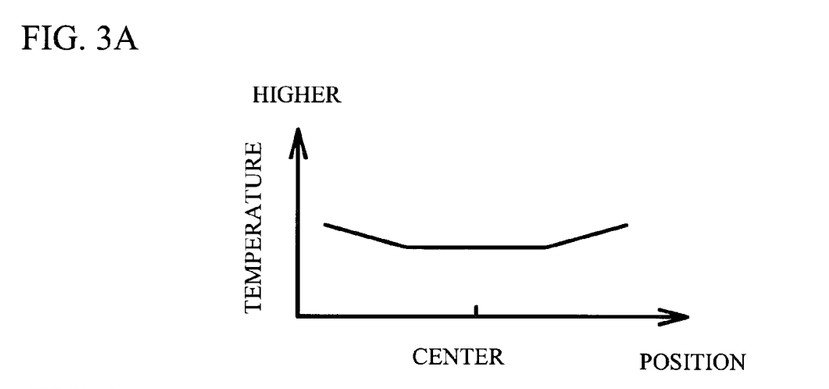
FIG. 3A illustrates a schematic temperature distribution of a substrate mounted on a susceptor of a first comparative embodiment.

Next, a description will be given of an effect of the susceptor 10. It is assumed that a susceptor of a first comparative embodiment has no groove 12. FIG. 3A illustrates a schematic temperature distribution of the substrate 100 mounted on the susceptor of the first comparative embodiment. A horizontal axis indicates a position. A vertical axis indicates temperature. In a case of the susceptor of the first comparative embodiment, in the temperature distribution of the substrate 100, temperature of an edge portion is higher than that of a center portion. This may be because heat amount conducted from the susceptor 10 to the edge portion of the substrate 100 is more than that conducted from the susceptor 10 to the center portion of the substrate 100. When the temperature distribution appears, quality of the semiconductor layer formed in the deposition process is not satisfied.

Figure 3B:
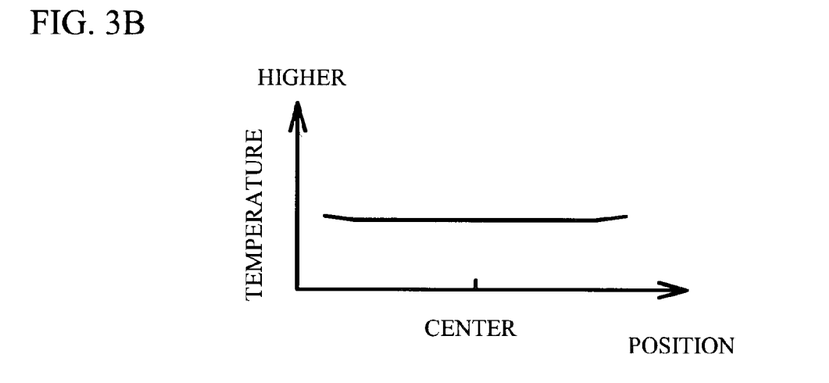
FIG. 3B illustrates a schematic temperature distribution of a substrate mounted on the susceptor of the first embodiment.

FIG. 3B illustrates a schematic temperature distribution of the substrate 100 mounted on the susceptor 10 of the first embodiment. A horizontal axis indicates position. A vertical axis indicates temperature. The temperature of the edge portion of the substrate 100 mounted on the susceptor 10 is lower than the case of the susceptor of the first comparative embodiment. Therefore, temperature variety in a plane direction of the substrate 100 mounted on the susceptor 10 gets smaller. This may be because the heat amount conducted from the susceptor 10 to the edge portion of the substrate 100 in the deposition process is reduced because of the groove 12 of the susceptor 10.

As mentioned above, with the semiconductor growing apparatus 5 and the susceptor 10, the heat amount conducted from the susceptor 10 to the edge portion of the substrate 100 in the deposition process is reduced because of the groove 12 of the susceptor 10. It is therefore possible to restrain that the temperature of the edge portion of the substrate 100 gets higher than that of the center portion in the deposition process.

The groove 12 of the susceptor 10 can be formed easily with a cutting process or the like. Manufacturing cost of the susceptor 10 may be lower than that of a susceptor having a ring-shaped hollow. Especially, the susceptor having the ring-shaped hollow is made by combining two members. This results in quality degradation of a semiconductor layer because of gas leak from the hollow. In contrast, the gas leak problem does not arise in the susceptor 10 because the groove 12 is not closed. Therefore, the susceptor 10 is useful.

Figure 4A:
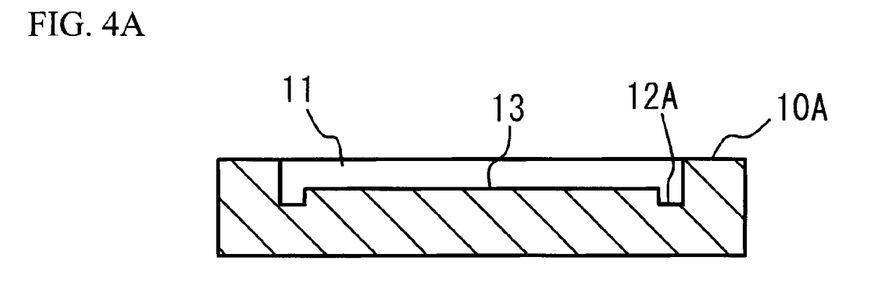
FIG. 4A illustrates a cross sectional view of a susceptor in accordance with a second comparative embodiment.

Next, a susceptor 10A is assumed as a second comparative embodiment, in order to describe another effect of the semiconductor growing apparatus 5 and the susceptor 10. FIG. 4A illustrates a cross sectional view of the susceptor 10A. The susceptor 10A is different from the susceptor 10 in a point that groove 12A is formed instead of the groove 12. The groove 12A is not formed in a side face of the susceptor 10A, but is formed throughout the circumference of the mounting face 13. When the deposition process is performed with the structure, reactant gas may get into the groove 12A under the lower face of the substrate 100 mounted on the mounting face 13.

Figure 4B:
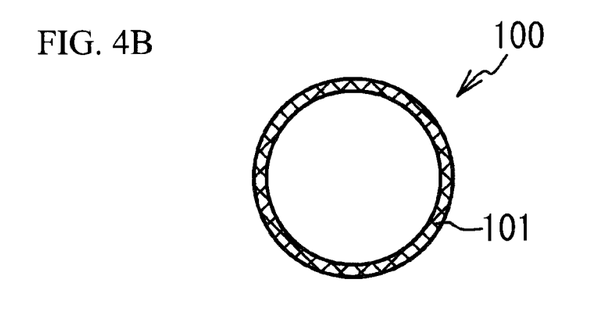
FIG. 4B illustrates a schematic view of a lower face of a substrate after a deposition process with the susceptor of the second comparative embodiment.
Figure 4C:
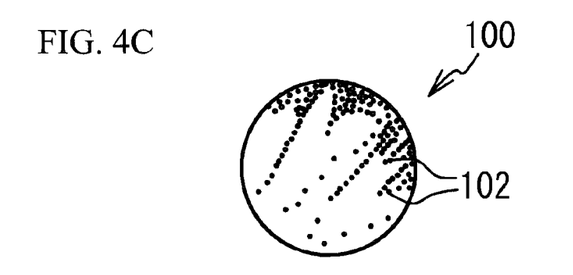
FIG. 4C illustrates a schematic view of an upper face of a semiconductor layer subjected to a re-growth process after washing of the substrate of FIG. 4B.

FIG. 4B illustrates a schematic view of the lower face of the substrate 100 after the deposition process with the susceptor 10A. The lower face of the substrate 100 faces with the mounting face 13 in the deposition process. FIG. 4C illustrates a schematic view of the upper face of the semiconductor layer subjected to a re-growth process after washing of the substrate 100 of FIG. 4B. As illustrated in FIG. 4B, a product 101 appears at the edge portion of the lower face of the substrate 100. It is thought that reactant gas getting into the groove 12A in the deposition process produces the product 101.

As illustrated in FIG. 4C, a hillock 102 is formed on the upper face of the semiconductor layer after the re-growth process. A cause of the formation of the hillock 102 may be as follows. That is, the product 101 on the lower face of the substrate 100 is peeled because of washing liquid during the washing of the substrate 100. The peeled product 101 may float on a liquid surface of the washing liquid. The floating product 101 is adhered to the upper face of the semiconductor layer when the substrate 100 is taken from the washing liquid. It is therefore thought that the hillock 102 is formed on the upper face of the semiconductor layer subjected to the re-growth process, when the semiconductor layer is subjected to the re-growth process with the product 101 being adhered thereto. When the hillock 102 is formed, the semiconductor layer does not provide sufficient performance. The product 101 may be one of causes degrading the quality of the semiconductor layer.

In contrast, in accordance with the semiconductor growing apparatus 5 and the susceptor 10, the mounting face 13 is flat. It is therefore restrained that reactant gas gets into between the substrate 100 and the mounting face 13 in the deposition process. Accordingly, it is restrained that the product 101 of the reactant gas is adhered to the lower face of the substrate 100.

Second Embodiment

Figure 5A:
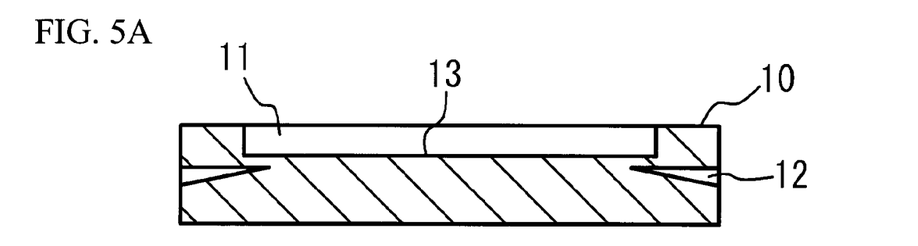
FIG. 5A through FIG. 5C illustrate a cross sectional view of a susceptor of a semiconductor growing apparatus in accordance with a second embodiment.
Figure 5B:
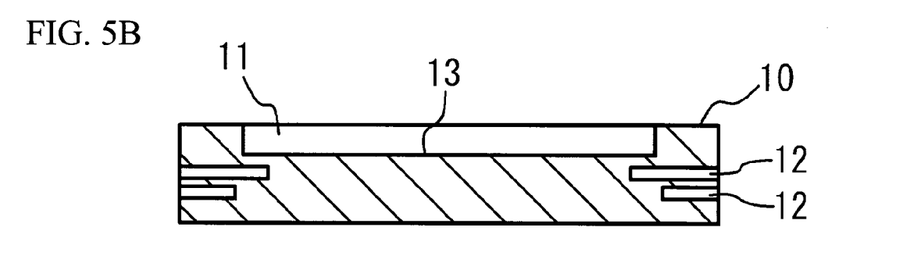
Figure 5C:
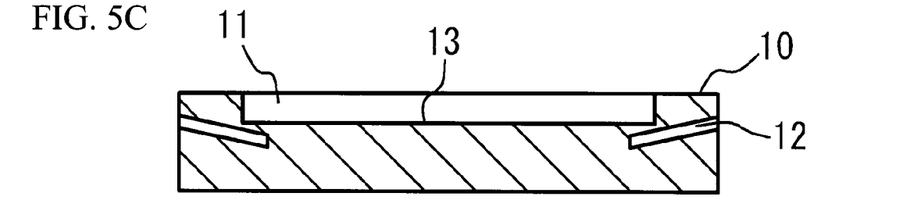

FIG. 5A through FIG. 5C illustrate a cross sectional view of the susceptor 10 of the semiconductor growing apparatus 5 in accordance with a second embodiment. The shape of the groove 12 or the number of the groove 12 of the susceptor 10 of the semiconductor growing apparatus 5 is modified in order to adjust the temperature distribution more particularly. The other structure is the same as the first embodiment.

For example, the cross sectional area of the groove 12 gets smaller, in accordance with the groove 12 leaves from the circumference of the susceptor 10. In FIG. 5B, the susceptor 10 has a plurality of the grooves 12 having a different depth from the side face of the susceptor 10. In FIG. 5B, the depth of one groove 12 on the side of the mounting face 13 is longer than that of another groove 12 on the side of the lower face of the susceptor 10. In FIG. 5C, the groove 12 is inclined with respect to the mounting face 13. In FIG. 5C, the groove 12 is inclined so that a first edge of the groove 12 on the side of the side face of the susceptor 10 is positioned higher than a second edge of the groove 12 on the side of the center of the susceptor 10.

The susceptor 10 in accordance with the second embodiment has the same effect as the susceptor in accordance with the first embodiment. With the susceptor 10 in accordance with the second embodiment, the heat amount conducted from the susceptor 10 to the substrate 100 changes gradually from inner side to outer side of the circumference portion of the substrate 100 in the deposition process. Therefore, the temperature distribution of the circumference portion of the substrate 100 may be adjusted with higher accuracy in the deposition process.

In the second embodiment, the structures of the grooves 12 of FIG. 5A to FIG. 5C may be combined. For example, each of the grooves 12 of FIG. 5B may have the shape of FIG. 5A or FIG. 5C. The groove 12 of FIG. 5A may be inclined with respect to the mounting face 13 like FIG. 5C. Each of the grooves 12 of FIG. 5B may have the shape of FIG. 5A and may be inclined like FIG. 5C.

Third Embodiment

Figure 6:
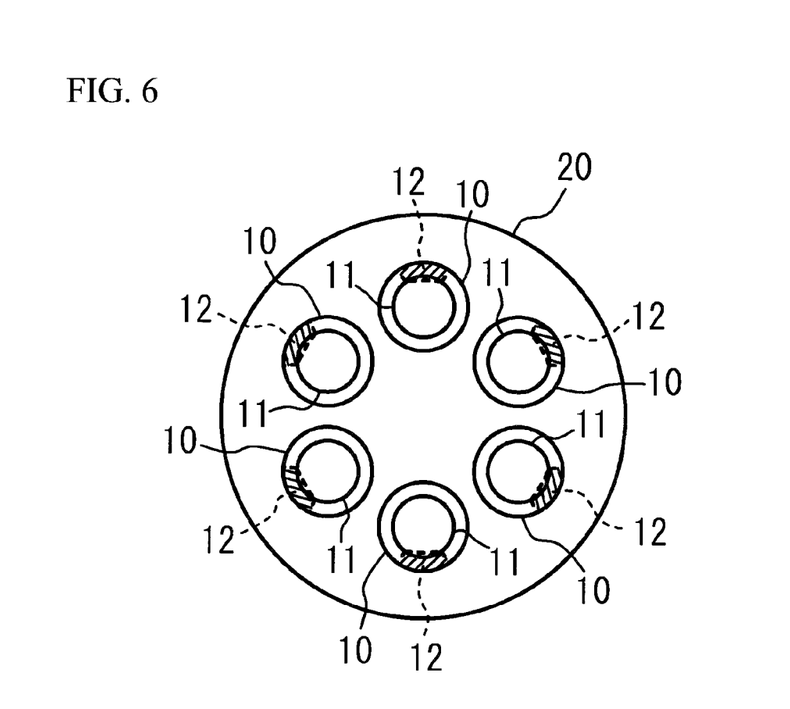
FIG. 6 schematically illustrates a top view of a tray and a susceptor of a semiconductor growing apparatus in accordance with a third embodiment.

FIG. 6 schematically illustrates a top view of the tray 20 and the susceptor 10 of the semiconductor growing apparatus 5 in accordance with a third embodiment. The susceptor 10 of the semiconductor growing apparatus 5 in accordance with the third embodiment is different from that of the first embodiment, in a point that the groove 12 is not formed throughout the side face of the susceptor 10. The other structure is the same as the first embodiment.

For example, the temperature of a part of the circumference portion of the mounting face 13 of the susceptor 10 may be high in the deposition process because of a relative positional relationship between the heater 30 and the tray 20, the shape of the tray 20 or the like. In this case, the groove 12 may not be formed throughout the side face of the susceptor 10. The groove 12 may be formed at a position corresponding to the portion of the mounting face 13 in which temperature tends to be higher.

For example, in FIG. 6, it is assumed that temperature on the side of the edge portion of the tray 20 tends to be higher than that on the side of the center portion of the tray 20. In this case, the groove 12 is partially formed in the side face of the susceptor 10 according to the portion of the susceptor 10 where the temperature tends to be higher. In this case, the same effect is obtained as the first embodiment.

The groove 12 may have the same structure as the second embodiment. In this case, the same effect is obtained as the second embodiment.

The present invention is not limited to the specifically disclosed embodiments and variations but may include other embodiments and variations without departing from the scope of the present invention.

What is claimed is:

1. A semiconductor growing apparatus comprising:
   a susceptor having a main face and a side face, the main face receiving a substrate for growing a semiconductor layer, the side face having a groove and a face opposite to the main face not having the groove; and
   a heating element for heating the susceptor,
   wherein the main face of the susceptor has a recess for receiving the substrate, and the groove and the recess are separated,
   wherein a part of the groove directly overlaps the recess in a planar view and the groove consists of an opening free of solid material formed within the susceptor by a cutting process.

2. The semiconductor growing apparatus according to claim 1, wherein the groove is formed around the side face of the susceptor.

3. The semiconductor growing apparatus according to claim 1, wherein a cross-sectional area of the groove becomes smaller in accordance with leaving from the side face of the susceptor.

4. The semiconductor growing apparatus according to claim 1, wherein the groove is inclined toward the main face from the side face of the susceptor.

5. The semiconductor growing apparatus according to claim 1, wherein:
   the susceptor has multiple grooves;
   and the grooves have a different depth.

6. The semiconductor growing apparatus according to claim 1, further comprising a tray for receiving the susceptor, wherein the heating element heats the substrate via the tray and the susceptor.

7. The semiconductor growing apparatus according to claim 6, wherein the tray receives a plurality of the susceptors.

8. The semiconductor growing apparatus according to claim 1, wherein the heating element is comprised of a resistive heater or a radio-heating element.

9. The semiconductor growing apparatus according to claim 1, wherein the susceptor is comprised of carbon, silicon carbide or aluminum nitride.

10. The semiconductor growing apparatus according to claim 1, wherein the semiconductor growing apparatus is CVD, MOCVD, or plasma CVD apparatus.

11. The semiconductor growing apparatus according to claim 1, wherein: the susceptor has an upper part, a lower part and a middle part located at there between; and
    the middle part has a diameter smaller than a diameter of the upper part and the lower part, and comprises a bottom part of the groove.

12. The semiconductor growing apparatus according to claim 1, wherein the groove is successively formed on the side face so as to surround the susceptor.

13. The semiconductor growing apparatus according to claim 1, wherein the groove is formed at an intermediate of a thickness direction of the susceptor.

14. A semiconductor growing apparatus comprising;
    a susceptor having a main face and a side face, the main face receiving a substrate for growing a semiconductor layer, the side face having a groove, and a face opposite to the main face not having the groove; and
    a heating element for heating the susceptor,
    wherein the main face of the susceptor has a recess for receiving the substrate, and the groove and the recess are separated,
    wherein a part of the groove directly overlaps the recess in a planar view and the groove consists of an opening free of solid material formed within the susceptor by a cutting process,
    wherein the groove has a rectangular shape in a cross section view.

15. The semiconductor growing apparatus according to claim 1, wherein the susceptor consists of a single monolithic material with the recess and groove formed therein.

* * * * *